United States Patent [19]

Iwasa

[11] 4,353,816
[45] Oct. 12, 1982

[54] POWER CONDUCTIVE COATING MIXED WITH COPPER POWDER

[75] Inventor: Yamahiro Iwasa, Hachioji, Japan

[73] Assignee: Asahi Chemical Research Laboratory Co., Ltd., Tokyo, Japan

[21] Appl. No.: 226,098

[22] Filed: Jan. 19, 1981

[30] Foreign Application Priority Data

Jan. 22, 1980 [JP] Japan .................................. 55-6609

[51] Int. Cl.³ ............................................. H01B 1/02
[52] U.S. Cl. .................................. 252/512; 252/511; 106/1.18
[58] Field of Search .............................. 252/512, 511; 260/37 EP, 37 M, 40 R; 106/1.05, 1.18

[56] References Cited

U.S. PATENT DOCUMENTS 2,564,823  8/1951  Wallace ........................... 204/129.5
3,412,043  11/1968 Gilliland ......................... 260/37 EP
3,983,075  9/1976  Marshall et al. ............... 260/37 EP
4,247,594  1/1981  Shea et al. ........................... 252/511

FOREIGN PATENT DOCUMENTS 51-93394  8/1976  Japan .

Primary Examiner—Joseph L. Schofer
Assistant Examiner—J. L. Barr
Attorney, Agent, or Firm—Ziems & Walter

[57] ABSTRACT

The power conductive coating is made of a combination in a liquid condition of 70–85 weight percent of copper powder, 15–30 weight percent of at least one selected from the group of phenol resin, epoxy resin, polyester resin and xylene resin, and a predetermined amount preferably 0.23–1.6 weight percent of at least one selected from the group of anthracene or the inducer thereof, anthranylic acid and anthrazine.

1 Claim, 7 Drawing Figures

Fig.1

| Speciments No. | Combination of Components | | | Drying Temperature & Time | Electric Resistance (Film Thickness 40μ) Ω-cm |
|---|---|---|---|---|---|
| | Copper Powder g | Phenol Resin g | Annex Agents | | |
| 1 | 80 | 20 | —— | 150°C 4H | $1 \times 10^3$ |
| 2 | 80 | 20 | Pseudo acid (H·COOH) 1g | " | $1 \times 10$ |
| 3 | 80 | 20 | Oxalic acid (HOOC)$_2$ 1g | " | $1 \times 10$ |
| 4 | 80 | 20 | Adipic acid (HOOC)$_2$·(CH$_2$)$_4$ 1g | " | 1 |
| 5 | 80 | 20 | Butyric acid C$_3$H$_7$·COOH 1g | " | 1 |
| 6 | 80 | 20 | Benzoic acid C$_6$H$_5$·COOH 1g | " | $1 \times 10^{-2}$ |
| 7 | 80 | 20 | Anthracene C$_{14}$H$_{10}$ | " | $1 \times 10^{-3}$ |
| 8 | 80 | 20 | Anthracene carbonilyc acid C$_{14}$H$_9$(COOH) 1g | " | $1 \times 10^{-3}$ |
| 9 | 80 | 20 | Anthranylic acid C$_6$H$_4$(NH$_2$)(COOH) 1g | " | $1 \times 10^{-3}$ |
| 10 | 80 | 20 | Anthrazine C$_{28}$H$_{16}$N$_2$ 1g | " | $1 \times 10^{-3}$ | he
POWER CONDUCTIVE COATING MIXED WITH COPPER POWDER

BRIEF DESCRIPTION OF THE INVENTION

The invention relates to a power conductive coating mixed with copper powder, and more particularly relates to such a power conductive coating which is mixed with the anthracene or the inducer thereof as a specific annex agent so as to remarkably heighten the power conductivity of the coating in the practical usage.

So far there has been the electrolytic copper leaf and the silver coating which are normally used as a conductor of the electric power or electronic circuits. The electrolytic copper leaf is widely used as something to be pressingly bound to the phenol resin laminated plate or the epoxy resin laminated plate to form a copper gilt thereover. In order to use such a resin laminated plate as an electric circuit, it is necessary at first to protect the circuit part with the anti-oxidization ink, and then to etch there with the ferric chloride. Then the copper gilt is melted except the part of circuit and the anti-oxidization ink is removed to expose the circuit part.

However according to this etching method, a great amount of copper gilt is required because the copper leaf has to be firstly bound to the entire face of the resin laminated plate (1 m×1 m), and the production of the circuit requires many processes and is time consuming due to the painting of anti-oxidization ink to the circuit part, the melting of copper gilt except the path of circuit and the removing the anti-oxidization ink. As the result, such a production of the print circuit becomes costly.

With respect to the method to form up a sintered circuit on the foliated circuit by using a power conductive coating such as the silver or palladium conductive coating, etc., such a precious metal is very expensive lately, and it is almost impossible to use such a material to the general electronic instruments in the point of cost.

It may be considered to provide a power conductive coating such as a mixture of copper powder and synthetic resin to solve the problems of the prior art as mentioned above. According to this method, heating is required to consolidate the applied coating. The copper powder in the coating is, however, oxidized by the heating and produces a big resistance against the electric current, and at the same time degrades the effect of soldering. This method is only proposed in the publicly opened Japanese patent application 51-93394, but has never been reduced to practice due to such disadvantages.

The present invention has been provided to eliminate the defects and disadvantages of the prior art, and it is a primary object of the invention to provide a power conductive coating mixed with copper powder which is remarkably excellent in power conductivity and practically available in this field of art. It is another object of the invention to easily produce the print circuit, thereby to considerably reduce the production cost as well as the material to be used.

In short, the invention comprises one effective component of 70–85 weight percent of copper powder, another effective component of 15–30 weight percent of one selected from the group of phenol resin, epoxy resin, polyester resin and xylene resin, and at least one, as a specific annex agent, selected from the group of anthracene and the inducer thereof, anthranylic acid and anthrazine.

The other features and advantages of the invention will be apparent from the following description of the preferred embodiments in reference to the attached drawings.

BRIEF DESCRIPTION OF THE DRAWINGS

FIG. 1 shows the details of embodiments of the invention in a table in contrast to the other experimented examples.

DETAIL DESCRIPTION OF THE INVENTION

Figure 2:
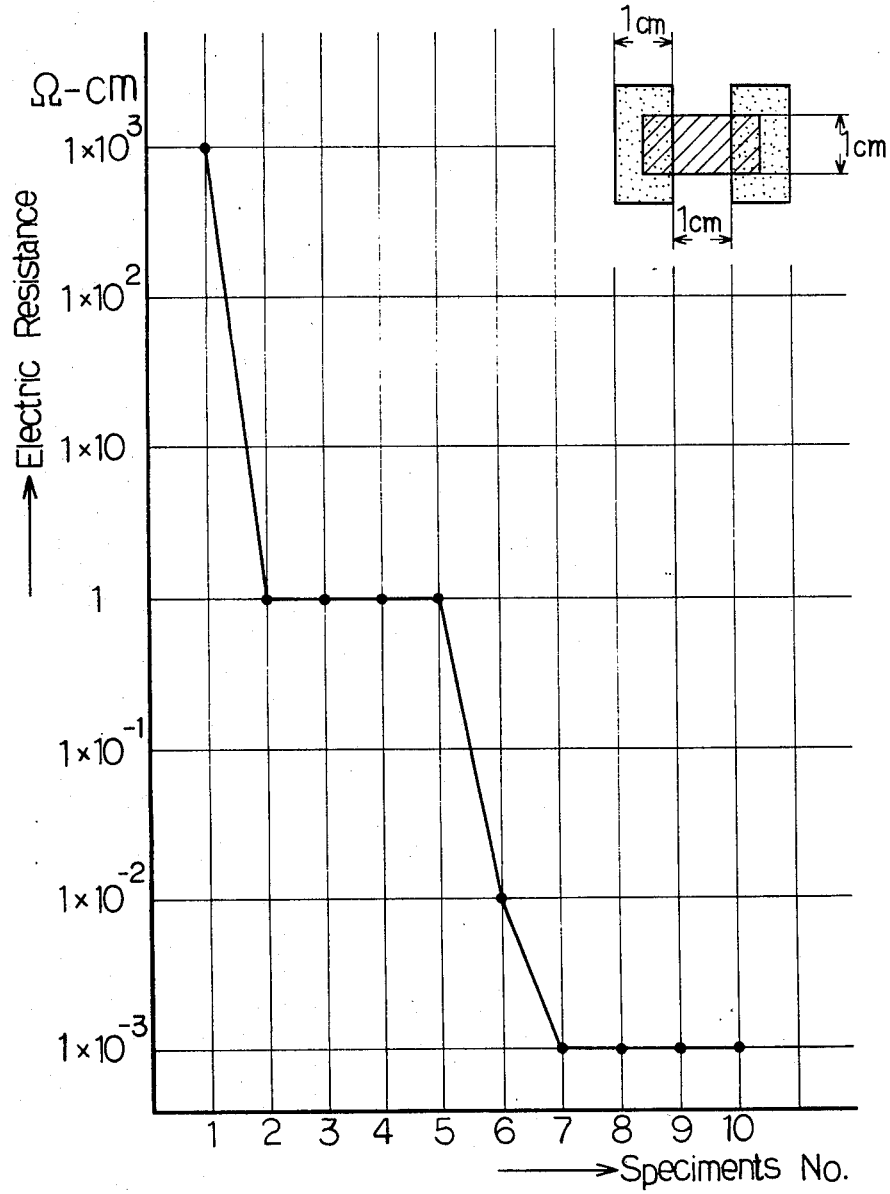
FIG. 2 shows a graph indicating the electric resistances of the embodiments of the invention plotted in accordance to the values of FIG. 1.

In order that the power conductive coating of the invention is to be practically usable, it is required that the film formed by the coating has an electric resistance approximately $1\times 10^{-3}$ $\Omega$-cm, and a resistance property against humidity, that is, a property of minimum deterioration in the lapse of time in the atmosphere of a high humidity, and also a temperature property which may cope with the conventional power conductive coating of silver with respect to the resistance against the temperature lower as well as higher than the normal temperature 20° C.

In a condition that the copper powder simply mixed with the phenol resin is painted, heated and dried, the copper powder is oxidized to be an oxidized copper due to the heating and comes to have an electric resistance $1\times 10^3$ $\Omega$-cm or more than that.

Generally the power conductive mechanism of a power conductive coating is formed up by a conducting path of a mutual contact between the metal powder grains contained in the coating. Since the metal powder grains, however, have the outer faces always covered by the oxidized substances which cause the coating to produce an extremely high resistance against the electric current, it is generally known by those who are skilled in the art that such a coating is not suited for the practical use. Silver is, however, something different because such a precious metal is not substantially accompanied by the oxidized substances, in effect giving no rise of the electric resistance. The other metals such as the copper powder or other mediocre metals employed by the invention produce a film of oxidized substances at the outer faces of the powder grains thereof instantly in the air as well known. It is, therefore, a matter of urgent to reduce the electric resistance at the contacts between the copper powder grains of the power conductive coating. Namely it becomes necessary to remove the oxidized substances in the course of forming the power conductive film so as to form up the conductive path by the face contacts of the metal atoms.

For attaining this object, it becomes necessary to eliminate the oxidized substances on the copper powder grains by some means. In the next place, it becomes necessary, after the completion of the power conductive mechanism of normal copper powder without the oxidized substances, to prevent the copper powder from giving a high electric resistance again in the course of heating treatment or due to the influence of outer oxygen in the course of actual use.

Accordingly, the satisfaction of the above mentioned first and second requirements is a key to make the power conductive coating of the invention practically usable. Namely it is a most important problem of the invention to determine a specific annex agent and the amount thereof to be added to the mixture of copper powder and synthetic regin.

The inventor of this application has succeeded to determine the specific annex agent and the amount thereof through many studies and experiments over many years and succeeded in the development of a new power conductive coating of copper powder which is to replace the conventional copper leaf and power conductive coating of silver.

The invention has been made practically usable as a power conductive coating of copper powder ACP-020 and ACP-030 produced by Asahi Chemical Research Laboratory Co., Ltd..

As an annex agent, the anthracene or the inducer thereof shows an excellent effect, especially anthracene ($C_{14}H_{10}$) and anthracene carbonylic acid ($C_{14}H_9COOH$) have shown the most excellent effect, and in the next place anthrazine ($C_{28}H_{16}N_2$) and anthranylic acid ($C_6H_4(NH_2)(COOH)$) have also shown the excellent effect. On the other hand, benzoic acid ($C_6H_5.COOH$) is almost unpracticable because it shows the electric resistance value $1 \times 10^{-2}$ $\Omega$-cm which is larger than that of anthracene or the inducer thereof by one figure.

The invention substantially comprises the mixture in a liquid condition of 70–85 weight percent of copper powder, 15–30 weight percent of at least one selected from the group of phenol resin, epoxy resin, polyester resin and xylene resin, and a slight amount, preferably 0.23–1.6 weight percent, of anthracene or the inducer thereof anthranylic acid or anthrazine, as an annex agent.

In order to make up a print circuit, it is enough to screeningly paint this coating on an insulated plate of phenol resin or the like only in the part of circuit, and then to heat it with the temperature of 150° C. for about four hours.

During the heating treatment, the anthracene by way of example, as the annex agent of the invention, melts the compounds of oxidized copper and other attached around the copper powder into the material of a nature substantially same with the coexisting resin. This phenomenon increases the electric conductivity, and additionally the compound of the annex agent and copper melted with the resin is effective to reduce the penetration rate of water and oxygen through the resin. The anti-oxidization effect made by the anthracene or the inducer thereof, anthranylic acid or anthrazine to the copper powder is as follows;

For example, the anthracene carbonylic acid ($C_{14}H_9COOH$) reacts to the oxidized copper existing or formed around the copper powder in the chemical formula, $CuO + 2C_{14}H_9COOH \rightarrow (C_{14}H_9COO)_2Cu + H_2O$, and produces the anthracene carbonylic acid cuprous salt. Due to the chemical reaction developed in the painted film which is intercepted from the outer atmosphere by the coexisting resin, the copper powder is deprived of the oxidized substances from the outer faces thereof and exposes the cleaned metal faces, which are arranged in contact to each other to form a desirable power conductive path of minimum electric resistance.

On the other hand, the anthracene carbonylic acid cuprous salt produced in the chemical reaction is melted into and evenly dispersed in the coexisting phenol resin, epoxy resin, polyester resin or xylene resin, and will not give adverse influence to the formation of screening film accompanied by the hardening reaction thereof with the contacted arrangement of the copper powder grains. Moreover, the copper compound of anthracene inducer properly mixed with the resin has an effect to lower the water and oxygen penetration rate of the resin and considerably increase the resistance against humidity and oxygen thereby to more highten the effect of the invention.

Figure 7:
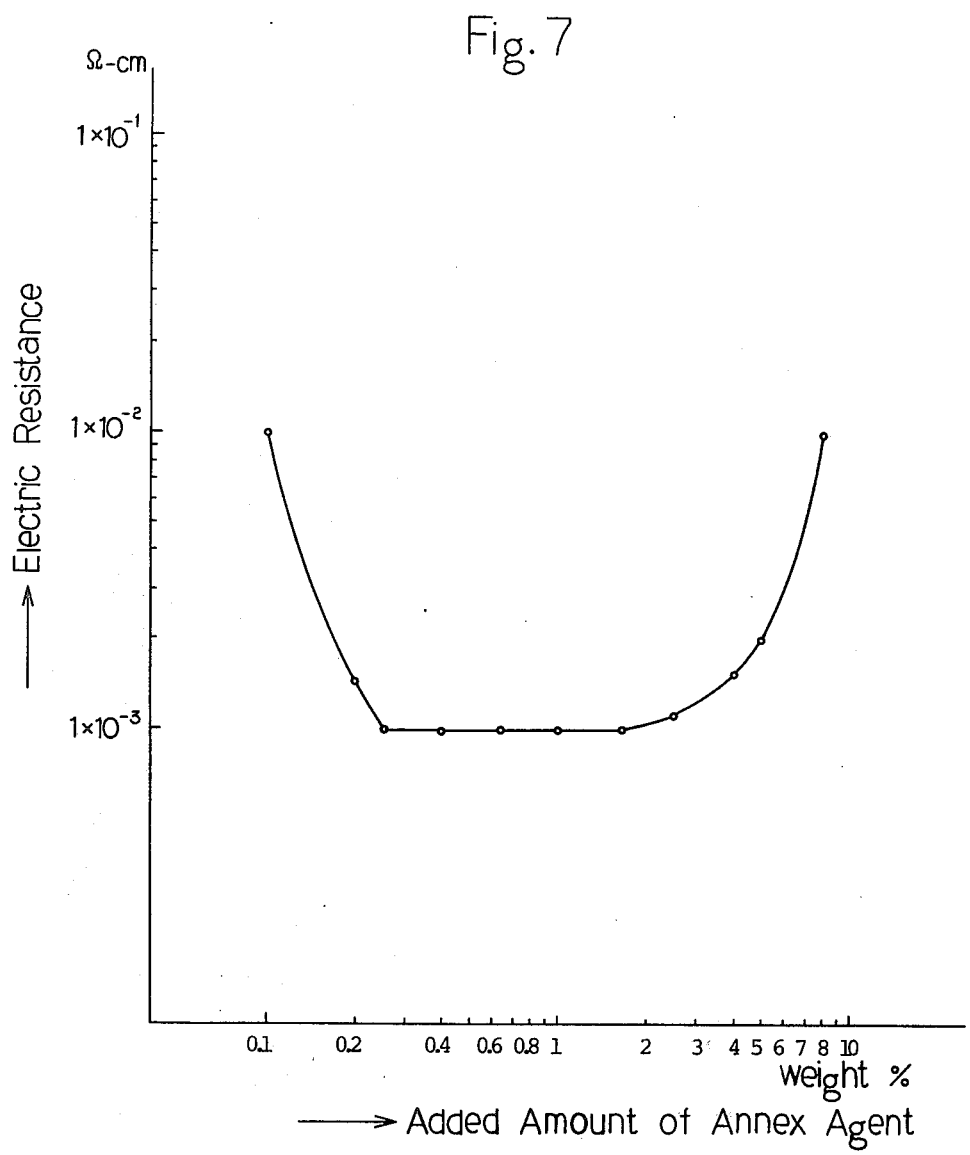
FIG. 7 shows a graph indicating the experimental values in the relations between the amounts of annex agent and the electric resistances of the embodiment of the invention.

In this case, it is experimentally confirmed that the most effective amount of the annex agent to be added is in the range from 0.23 weight percent to 1.6 weight percent as shown in FIG. 7.

In FIG. 7, the added amounts of anthracene or the inducer thereof are shown along the lateral axis, and the electric resistances ($\Omega$-cm) of the coating in the film thickness 40$\mu$ are shown along the vertical axis. According to these experiments, the coating maintains a constant electric resistance $1 \times 10^{-3}$ $\Omega$-cm indicating an extremely desirable effect, in case the added amount of anthracene or the inducer thereof is about 0.23–1.6 weight percent. In case the added amount of the annex agent is 0.2 weight percent, the coating shows the electric resistance $1.3 \times 10^{-3}$ $\Omega$-cm, and also in case the added amount of the annex agent is 5 weight percent, the coating shows the electric resistance $2 \times 10^{-3}$ $\Omega$-cm. It is easily understood that these amounts of the annex agent are also within the permissible range of practical use of the coating. It is, however, seen that the coating shows a radical increase of electric resistance in case the amount of the annex agent is less than 0.2 weight percent. Actually the coating shows the electric resistance $1 \times 10^{-2}$ $\Omega$-cm in case the amount of the annex agent is 0.1 weight percent, which is a value unsuitable for practical usage of the coating. Similarly in case the amount of the annex agent is more than 5 weight percent, the coating shows a radical increase of electric resistance, and actually shows the electric resistance $1 \times 10^{-2}$ $\Omega$-cm in case the amount of the annex agent is 8 weight percent, which is also a value unsuitable for practical use of the coating. The above mentioned effects of experiments are same with respect to the other annex agents such as anthranylic acid and anthrazine.

As the reason that the above mentioned critical values have been experimentaly confirmed, the following mechanism is considered. Namely as is mentioned with respect to the function mechanism in the case of the anthracene carbonylic acid employed as the annex agent, a theory of chemical weight is produced as a matter of course between the annex agent and the oxidized substances, in the course of reaction by the annex agent to the oxidized substances attached around the outer forces of copper powder grains melting and removing the oxidized substances from the copper powder. Therefore it is impossible to completely prevent the oxidization of copper powder during the treatment thereof in the air even if the copper powder is of the nature comparatively reluctant to oxidization. The fact that a minimum amount of annex agent (about 0.2 weight percent) shows that there is a minimum amount of oxidized substances in the mixture of copper powder and resin. Similarly the fact that a maximum amount of annex agent (about 5 weight percent) is found out from experiments shows that an exceeded amount of annex agent will give an adverse influence, for example, to deteriorate the property of the coexisting resin, lowering the power conductivity of the coating.

Figures 4, 5:
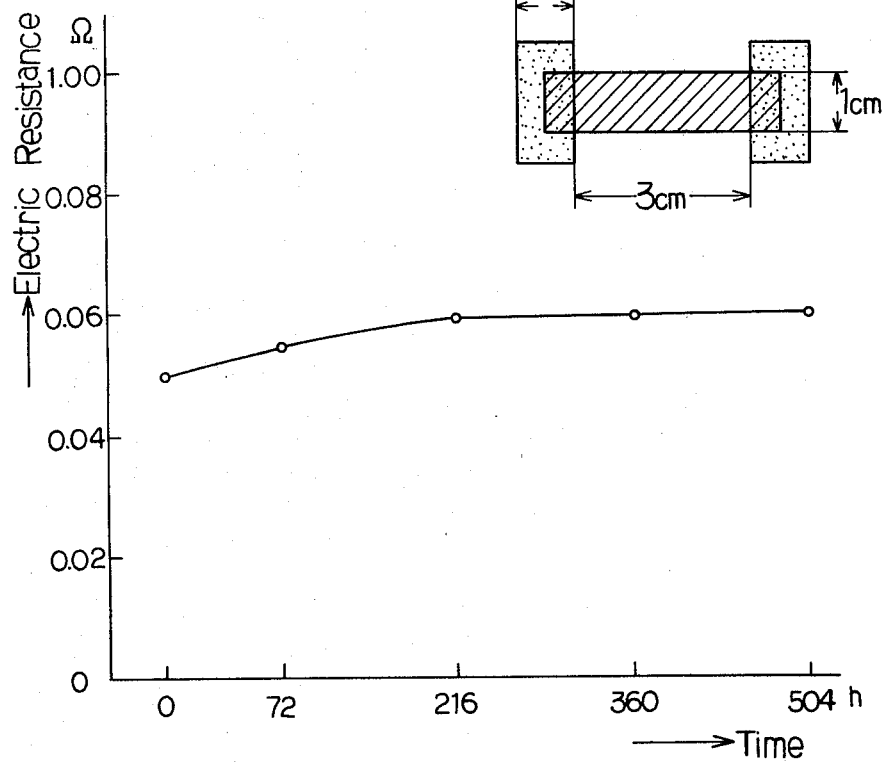
FIG. 4 shows a graph indicating the anti-humidity property of the first embodiment of the invention.
FIG. 5 shows a plan view of a specimen for obtaining the test effects of FIG. 4.

According to the above mentioned structure of power conductive coating, the electric property, for example in the case of the film thickness $40\mu$ of the print circuit, can be indicated as $1 \times 10^{-3}$ $\Omega$-cm by an electric resistance value which is an surprising effect showing about 1/1,000,000 of the resistance value in contrast to the coating without any annex agent as shown in FIGS. 1 and 2. As to the resistance property against humidity, the electric resistance increases slightly as will be described herein in detail, but is maintained unchanged after about 504 hours. Subsequently no change or deterioration is seen in the lapse of time as shown in FIG. 4.

Figure 6:
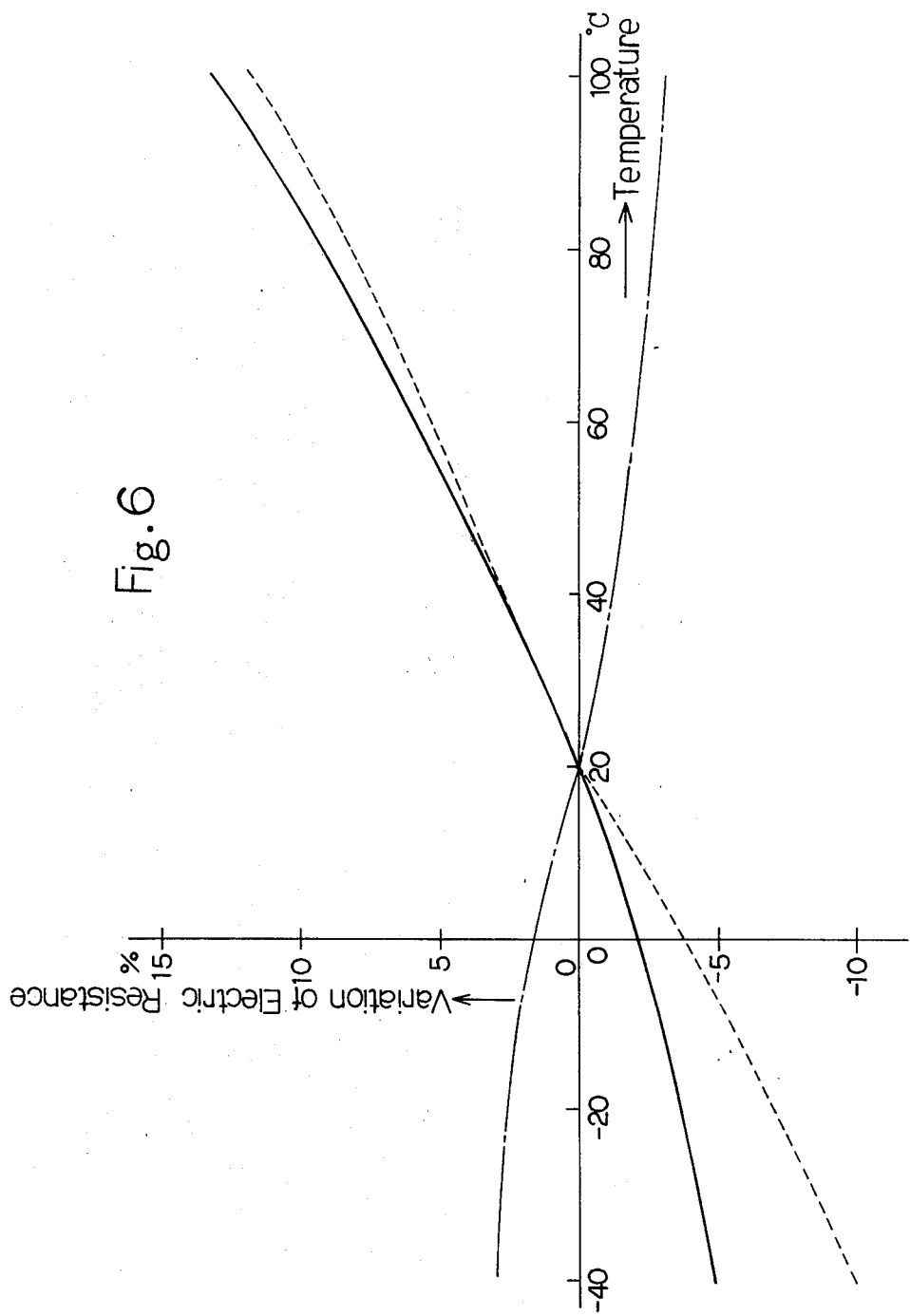
FIG. 6 shows a graph indicating a variation of electric resistance against temperature of the first embodiment of the invention.

As to the resistance property against temperature, the electric resistance changing rate is extremely excellent and about ½ of that of the power conducting coating of silver in a condition below the normal temperature, and is almost the same with that of the latter in a condition above the normal temperature. As shown in FIG. 6, the coating of the invention cap cope with the coating of silver in the practically used condition of temperature about 60° C.

As is apparent from the above mentioned structure and effect, the invention provides an extremely excellent power conductive coating of copper powder which is enough for practical use, instead of the conventional electrolytic copper leaf and the etching thereof as well as the coating of silver. Moreover the invention has the advantages of making easier the production of print circuit, saving the materials and therefore lowering the production cost. Thus it may be said that the invention is industrially epoch making.

Figure 3:
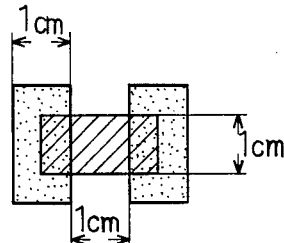
FIG. 3 shows a plan view of a specimen for obtaining the test effects of FIG. 2.

In reference to FIG. 1 showing the embodiments of the invention in contrast to the other experimented examples, the explanation is as follows; Specimen No. 1 is a mixture of copper powder 80 g and phenol resin 20 g without no annex agent. The coating is screeningly painted on an insulated plate of phenol resin with a film thickness $40\mu$, and is heated for four hours with a temperature 150° C. The electric resistance of the print circuit of 1 cm long by 1 cm wide is $1 \times 10^3$ $\Omega$-cm as shown in FIGS. 1-3. Specimen No. 2 is measured under the same conditions with those of the specimen No. 1 except for pseudo-acid 1 g added as an annex agent. The electric resistance is $1 \times 10$ $\Omega$-cm. Specimen No. 3 is as shown added with oxalic acid 1 g as an annex agent, and the electric resistance is $1 \times 10$ $\Omega$-cm. Specimen No. 4 is as shown added with adipic acid 1 g as an annex agent, and the electric resistance is 1 $\Omega$-cm. Specimen No. 5 is as shown added with butyric acid 1 g as an annex agent, and the electric resistance is 1 $\Omega$-cm. Specimen No. 6 is as shown added with Benzoic acid 1 g as an annex agent, and the electric resistance is $1 \times 10^{-2}$ $\Omega$-cm which is the value almost unpractical. Specimen No. 7, which is a first embodiment of the invention, is as shown added with anthracene 1 g as an annex agent, and the electric resistance is $1 \times 10^{-3}$ $\Omega$-cm. Specimen No. 8, which is another embodiment of the invention, is as shown added with anthracene carbonylic acid 1 g as an annex agent, and the electric resistance is $1 \times 10^{-3}$ $\Omega$-cm. Specimen No. 9, which is another embodiment of the invention, is as shown added with anthranilic acid 1 g as an annex agent, and the electric resistance is $1 \times 10^{-3}$ $\Omega$-cm. Specimen No. 10, which is still another embodiment of the invention, is as shown added with anthrazine 1 g as an annex agent, and the electric resistance is $1 \times 10^{-3}$ $\Omega$-cm.

FIG. 4 shows a resistance property against humidity of a print circuit obtained by the first embodiment of the invention as the result of a test in which the coating of the invention is painted on an insulated resin plate of 1 cm long by 3 cm wide. The both ends of the plate is covered by the silver poles as shown in FIG. 5 and placed in the temperature 42° C.±2° C. with the humidity 90-95% R.H to measure the variation of electric resistance of the coating in the lapse of time. As the result, as shown in FIG. 4, the electric resistance is approximately 0.05$\Omega$ in the period, 0-72 hours, 0.0595$\Omega$ in 216 hours, 0.06$\Omega$ in 360 hours, 0.0605$\Omega$ in 504 hours, and is unchanged in the subsequent lapse of time. Thus the coating of the invention has shown an extremely excellent resistance property against humidity in such a hard condition. The result of the test is same with respect to all other embodiments of the invention.

FIG. 6 shows a resistance property against temperature of the first embodiment of the invention measured in a room temperature with a method prescribed by the Japanese Industrial Standards (JIS). The electric resistance of the print circuit of the coating shows as indicated by the solid line, a desirable variation effect below the temperature 20° C., which is ½ of that of the power conductive coating of silver which is indicated by the broken line. Even in the condition above the temperature 20° C., the electric resistance of the coating shows an excellent effect which is enough to cope with that of the coating of silver. Especially in the neighbourhood of 60° C. which is the upper limit of normal temperature in which the coating is practically used, the variation effect of the coating is almost the same with that of the coating of silver. In this connection, the pointed chain line in FIG. 6 shows the variation effect of electric resistance of carbon coating.

According to the embodiments of the invention, only the phenol resin is shown as a synthetic resin. It has, however, been found out that the same effect is obtained by other kinds of resin such as epoxy resin, polyester resin and xylene resin.

The added amount of anthracene or the inducers thereof is, as shown in FIG. 7, preferably about 0.23-1.6 weight percent according to the invention. It has however been found out that the permissible amount of the annex agent may be 0.2-5 weight percent in the practical use of the coating. It is needless to say that this is substantially same with respect to anthranylic acid and anthrazine.

I claim:

1. A power conductive coating consisting of a mixture in a liquid condition of 70-85 weight percent of copper powder, 15-30 weight percent of at least one selected from the group of phenol resin, epoxy resin, polyester resin and xylene resin, and 0.2-5 weight percent of at least one annex agent selected from the group of anthracene, anthracene carbonylic acid, anthranylic acid and anthrazine.

* * * * *